United States Patent
Lee et al.

(10) Patent No.: US 8,082,876 B2
(45) Date of Patent: *Dec. 27, 2011

(54) MANUFACTURING METHOD OF OLED DISPLAY AND APPARATUS FOR MANUFACTURING THE OLED DISPLAY

(75) Inventors: Seong Taek Lee, Suwon-si (KR); Jang Hyuk Kwon, Suwon-si (KR); Tae Min Kang, Suwon-si (KR); Joon Young Park, Seoul (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 140 days.

This patent is subject to a terminal disclaimer.

(21) Appl. No.: 12/536,590

(22) Filed: Aug. 6, 2009

(65) Prior Publication Data

US 2009/0296757 A1    Dec. 3, 2009

Related U.S. Application Data

(60) Division of application No. 11/211,706, filed on Aug. 26, 2005, now Pat. No. 7,588,795, which is a continuation-in-part of application No. 11/145,936, filed on Jun. 7, 2005, now Pat. No. 7,563,477, which is a continuation of application No. 09/935,332, filed on Aug. 23, 2001, now Pat. No. 6,936,300.

(30) Foreign Application Priority Data

Aug. 24, 2000 (KR) ................................. 2000-49287

(51) Int. Cl.
*C23C 16/00* (2006.01)

(52) U.S. Cl. ...................................... 118/620; 118/50.1
(58) Field of Classification Search .................. 118/620, 118/50.1
See application file for complete search history.

(56) References Cited

U.S. PATENT DOCUMENTS

| | | | |
|---|---|---|---|
| 4,819,033 A | 4/1989 | Yoshitake et al. | |
| 5,290,280 A | 3/1994 | Daikuzono | |

(Continued)

FOREIGN PATENT DOCUMENTS

CN    1035006    8/1989

(Continued)

OTHER PUBLICATIONS

U.S. Appl. No. 11/211,706, filed Aug. 26, 2005, Seong-Taek Lee et al., Samsung Mobile Display Co., Ltd.

*Primary Examiner* — Keath Chen
(74) *Attorney, Agent, or Firm* — Christie, Parker & Hale, LLP

(57) ABSTRACT

A manufacturing method of an active matrix organic light emitting diode (AMOLED) display and an apparatus for manufacturing the AMOLED display, where the display has improved surface flatness and thickness uniformity as well as an improved image quality at edge regions of a pattern. According to the exemplary embodiment of the present invention, an anode electrode is formed on a lower structure of a substrate, an organic layer is formed on the anode electrode by imaging a complex laser beam on a donor film disposed on the substrate having light emitting materials, the complex laser beam having energy distribution inclination over 2%/μm at a threshold energy. The donor film is removed, and a cathode electrode is formed on the organic layer.

3 Claims, 4 Drawing Sheets

U.S. PATENT DOCUMENTS

| | | | |
|---|---|---|---|
| 5,482,803 A | 1/1996 | Ishiwata et al. | |
| 5,521,035 A | 5/1996 | Wolk et al. | |
| 5,685,939 A | 11/1997 | Wolk et al. | |
| 5,688,551 A | 11/1997 | Littman et al. | |
| 5,990,924 A | 11/1999 | Kido et al. | |
| 6,048,573 A | 4/2000 | Tang et al. | |
| 6,080,643 A * | 6/2000 | Noguchi et al. | 438/487 |
| 6,097,147 A | 8/2000 | Baldo et al. | |
| 6,114,088 A | 9/2000 | Wolk et al. | |
| 6,137,631 A | 10/2000 | Moulin | |
| 6,242,140 B1 | 6/2001 | Kwon et al. | |
| 6,358,664 B1 | 3/2002 | Nirmal et al. | |
| 6,420,031 B1 | 7/2002 | Parthasarathy et al. | |
| 6,936,300 B2 | 8/2005 | Lee et al. | |
| 7,563,477 B2 | 7/2009 | Lee et al. | |
| 2001/0004469 A1 | 6/2001 | Himeshima et al. | |

FOREIGN PATENT DOCUMENTS

| | | |
|---|---|---|
| EP | 0 851 714 | 7/1998 |
| JP | 4-1725 | 1/1992 |
| JP | 4-77717 | 3/1992 |
| JP | 4-100005 | 4/1992 |
| JP | 5-53008 | 3/1993 |
| JP | 6-242311 | 9/1994 |
| JP | 6-265720 | 9/1994 |
| JP | 7-56014 | 3/1995 |
| JP | 7-104113 | 4/1995 |
| JP | 7-146480 | 6/1995 |
| JP | 8-190012 | 7/1996 |
| JP | 10-206625 | 8/1998 |
| JP | 10-208881 | 8/1998 |
| KR | 10-1998-084557 | 12/1998 |
| KR | 10-2000-0020873 | 4/2000 |

* cited by examiner

MANUFACTURING METHOD OF OLED DISPLAY AND APPARATUS FOR MANUFACTURING THE OLED DISPLAY

CROSS-REFERENCE TO RELATED APPLICATIONS

This application is a divisional of U.S. patent application Ser. No. 11/211,706, filed Aug. 26, 2005, now U.S. Pat. No. 7,588,795 which is a continuation-in-part of U.S. patent application Ser. No. 11/145,936, filed on Jun. 7, 2005, now U.S. Pat. No. 7,563,477, which is a continuation of U.S. patent application Ser. No. 09/935,332, filed on Aug. 23, 2001, now U.S. Pat. No. 6,936,300, and claims the benefit of Korean Application No. 2000-49287 filed in the Korean Intellectual Property Office on Aug. 24, 2000, the disclosures of which are incorporated herein by reference.

BACKGROUND OF THE INVENTION

1. Field of the Invention

An aspect of the present invention relates to a manufacturing method of an active matrix organic light emitting diode (AMOLED) display and an apparatus for manufacturing the active matrix organic light emitting diode (AMOLED) display. More particularly, an aspect of the present invention relates to a method for fabricating an organic light emitting diode (OLED) display having improved surface flatness and thickness uniformity as well as an improved image quality at edge regions of a pattern.

2. Description of the Related Art

An OLED display is a display device that electrically excites fluorescent organic material for emitting light and forms an image by controlling a voltage or current of N×M numbers of organic light emitting cells.

Each of the light emitting cells include an anode electrode which is a hole injection electrode, an organic layer having an light emitting layer (EML), and a cathode electrode which is an electron injection electrode. Excitons are formed by combining holes and electrons implanted into an organic layer from the respective electrode, and an image is displayed when the excitons are reduced from an excited state to a ground state.

Generally, the organic layer is formed by a multi-layer structure including an electron transport layer (ETL), a light emitting layer and hole transport layer (HTL), and the multi-layer structure may further includes an electron injection layer (EIL) and a hole injection layer (HIL).

In the OLED display having the above described organic light emitting cells, the organic layer is designed to create three colors (i.e., red (R), green (G), and blue (B)).

In addition, the organic layer is generally formed by a vacuum evaporative deposition process using a shadow mask or by a conventional optical etching process.

However, the vacuum evaporative deposition process has limitations reducing the physical gap between the patterns, and it is difficult to form a minute pattern to a level of tens of μm's which is required to prevent the possible deformation of the mask.

When the optical etching process is applied, although it is possible to form the minute pattern, practical application becomes difficult since the property of the light emitting material forming the light emitting layer may be deteriorated by the developing solution or the etching solution.

Therefore, a thermal transferring method has been recently proposed to form the light emitting layer.

The thermal transferring method converts light emitted from a light source into thermal energy by which an image formation material is transferred to a substrate to form a color pattern. Therefore, to perform the thermal transferring method, a light source, a donor film and a substrate are required.

Relating to the thermal transferring method, U.S. Pat. No. 5,521,035 discloses a method for manufacturing a color filter for a liquid crystal display by a laser thermal transferring method.

In this patent, the color filter is manufactured by a laser induction thermal transferring method for transferring a color material from a donor film to a substrate such as a glass or a polymeric film. As a laser unit, an Nd:YAG laser system is used for transferring the color material to the surface of the substrate.

As shown in FIG. 1, the Nd:YAG laser forms a Gaussian beam B1 having an energy distribution of a Gaussian function. When a diameter of the Gaussian beam B1 is set large (approximately, above 60 μm), the inclination of the energy distribution is smoothly reduced as it goes away from the center point O.

Therefore, as shown in FIG. 2, when the light emitting layer is formed by imaging the Gaussian beam B1 having a predetermined diameter to a donor film 100 in an X-direction, the image quality at the light emitting layer corresponding to an edge region 110 of the donor film 100 is deteriorated compared to a central portion along a Y-direction.

When the energy of the laser beam is intensified to improve the image quality at the edges in order to solve the above problem, although the image quality at the edges may be enhanced, the surface of the image pattern becomes irregular since the energy is excessively increased at the central portion.

In addition, when the laser thermal transferring method is used, the light emitting layer needs to be more carefully formed compared to the color filter.

That is, in a case of the color filter, color materials being transferred to a substrate using the laser thermal transferring method are formed by distributing pigments for color change into a binder polymer (e.g., acrylic resin or epoxy resin), and at this time, a rate of concentration of the pigments is from 20 to 40%.

However, the binder polymer is simply pervious to light. Accordingly, types of binder polymer vary in order to form an appropriate color pattern, and color materials for forming an appropriate pattern may be formed by changing a molecular weight or a glass transition temperature (Tg) value. In general, the color materials have a 60 to 120° Tg value and a 1,500 to 5,000 molecular weight, and a color layer of the color filter formed by the color materials has approximately 1 to 2 μm thickness.

However, slight changes to the properties of the light-emitting material (e.g., Tg value and molecular weight) highly affect the quality of the OLED display.

Accordingly, it is preferable, but not necessary, to adjust the pattern quality by adjusting the laser transfer characteristics rather than by modifying the properties of the light-emitting material since a limit of pattern quality is controlled by the laser transferring conditions.

In addition, since the light emitting materials used in the OLED display have a molecular weight of approximately 10,000 to 100,000 and a Tg value of over 100°, a process for forming the organic layer using the light emitting materials is more difficult than a process for forming the color layer by using the color materials.

A desired thickness of the organic layer formed by the laser thermal transferring method is about 50 to 100 nm, which is thinner than the thickness of the color filter.

Accordingly, when the formed organic layer is thinner than the color layer, the laser beam transferring condition and energy distribution are more carefully controlled compared to when the formed organic is thicker than the color filter.

The above information disclosed in this Background section is only for enhancement of understanding of the background of the invention and therefore it may contain information that does not form part of the prior art already known in this country to a person of ordinary skill in the art.

SUMMARY OF THE INVENTION

According to an aspect of the present invention, there is provides a method for manufacturing an organic light emitting diode (OLED) display having improved surface flatness and thickness as well as improved image quality at edge regions of a pattern According to another aspect of the present invention, there is provided a manufacturing method of an OLED display, including, forming an organic layer on the anode electrode by imaging a complex laser beam on a donor film disposed on the substrate having light emitting materials, wherein the complex laser beam has energy distribution inclination over 2%/μm at a threshold energy.

According to another aspect of the present invention, the complex laser beam is formed by a composition of more than two laser beams having different inclinations of energy distribution at the threshold energy. For example, the complex laser beam may be formed of a laser beam having a 40 to 200 μm diameter in a direction vertical to a scan direction and energy distribution inclination over 1.0%/μm at the threshold energy and a laser beam having a 30 to 75 μm diameter in the direction vertical to the scan direction and energy distribution inclination over 3.0%/μm at the threshold energy.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
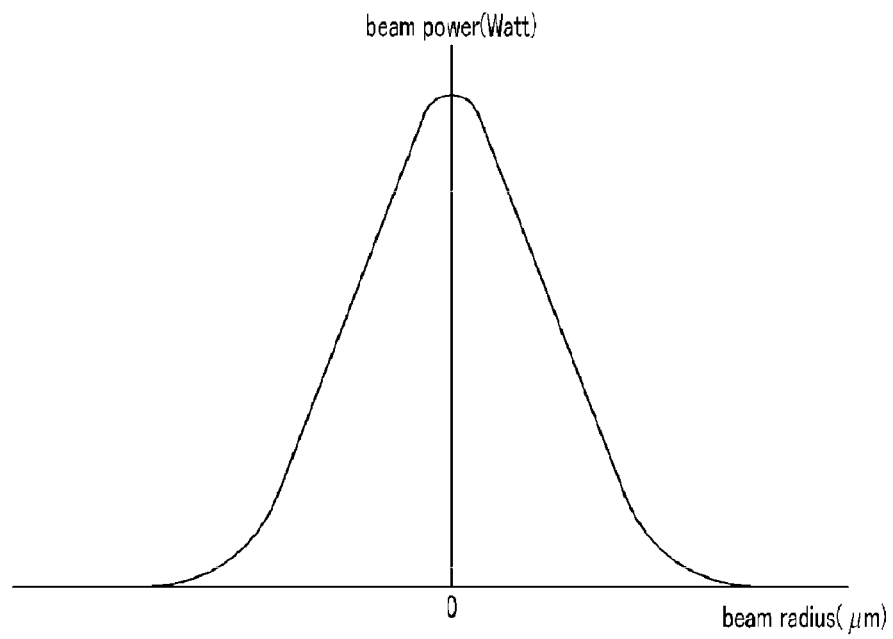
FIG. 1 shows a graph representing energy distribution of a laser beam used in a conventional thermal transferring method.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Figure 3:
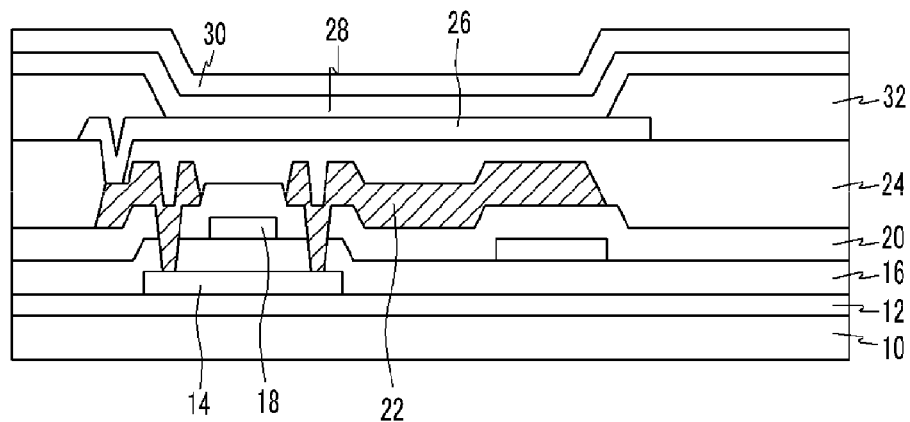
FIG. 3 shows schematic diagram of an OLED display having an organic layer formed in a thermal transferring method according to an exemplary embodiment of the present invention.
Figure 4:
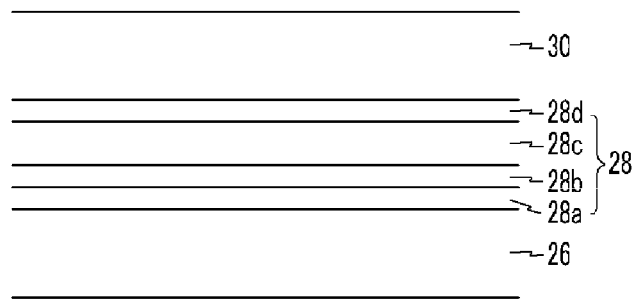
FIG. 4 shows a schematic diagram of a configuration of the organic layer shown in FIG. 3
Figure 5:
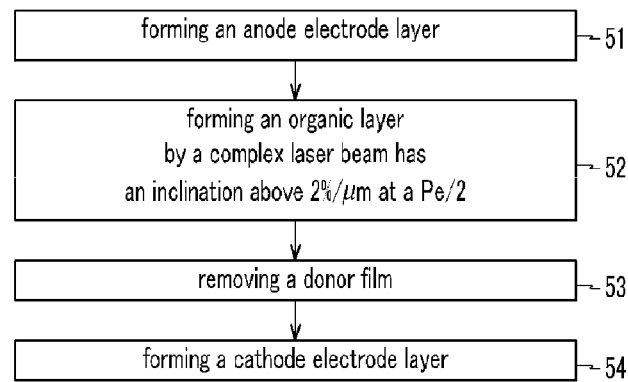
FIG. 5 shows a block diagram representing a manufacturing method of an OLED display according to an exemplary embodiment of the present invention.

FIG. 3 shows schematic diagram of an OLED display having an organic layer formed in a thermal transferring method according to an exemplary embodiment of the present invention, FIG. 4 shows a schematic diagram of a configuration of the organic layer shown in FIG. 3, and FIG. 5 shows a block diagram representing a manufacturing method of an OLED display according to an exemplary embodiment of the present invention.

As shown in FIG. 3, a buffer layer 12 is formed on a substrate 10, a polysilicon 14 is formed on a part of the buffer layer 12, and a gate insulating layer 16 is formed on the polysilicon 14 and buffer layer 12.

A transparent glass substrate or opaque resin substrate may be used for the substrate 10.

A gate electrode 18 is formed on the gate insulating layer 16, an interlayer insulating layer 20 is formed on the gate electrode 18 and gate insulating layer 16, and a source/drain electrode 22 is formed on the interlayer insulating layer 20.

The source/drain electrode 22 is electrically connected to the gate electrode 18 through a contact hole of the interlayer insulating layer 20.

A passivation layer 24 is formed on the source/drain electrode 22 and interlayer insulating layer 20, and an anode electrode 26 is formed on the passivation layer 24.

The anode electrode 26 is electrically connected to the source/drain electrode 22 through a contact hole of the passivation layer 24.

As described above, after the anode electrode 26 is formed on a lower structure of the substrate 10, an organic layer 28 and cathode electrode 30 is formed on the anode electrode 26, and a pixel dielectric layer 32 is formed between the passivation layer 24 and the organic layer 28.

The lower structure includes elements 12 to 22 formed on the passivation layer 24 and under the passivation layer 24.

The organic layer 28 is formed so as to create one color of R, G and B, and may be formed by a multi-layer structure including a hole injection layer 28a, a hole transport layer 28b, a light emitting layer 28c, and an electron transport layer 28d.

While not illustrated, the electron injection layer (EIL) may be formed between the electron transport layer 28d and a cathode layer 30.

Generally, the hole injection layer 28a, and the hole transport layer 28b are formed between the light emitting layer 28c and the anode electrode 26, and the electron transport layer 28d is formed between the light emitting layer 28c and the cathode electrode 30.

The hole injection layer 28a and hole transport layer 28b are used for appropriately transferring and implanting the holes and for stably forming an interface on a surface of an inorganic anode electrode 26.

Aromatic amine compounds called as arylamine may be used for the hole injection layer 28a and hole transport layer 28b.

In further detail, one material selected from the group consisting of CuPC (Copper phthalocyanine), mTDATA (4,4',4''-Tris(N-3-methylphenyl-N-phenyl-amino)-triphenylamine), TDAPB (1,3,5-tris(N,N'-bis(4-methoxyphenyl)-aminophenyl)benzene)triphenylamine), 1-NaphDATA (4,4',4''-tris-[N-(1-naphtyl)-N-phenylamino]-triphenylamine), and TPTE (triphenylamine tetramer) may be used for forming the hole injection layer 28a, and one material selected from the group consisting of TPD (N,N'-diphenyl-N,N'-bis(3-methylphenyl)-1,1'-diphenyl-4,4'-diamine), NPB (N,N'-diphenyl-N,N'-bis(1-naphthyl)-(1,1'-biphenyl)-4,4'-diamine), and Spiro-TPD (2,2,7,7-tetra-(3-methyldiphenylamino)-9,9'-spirobifluorene) may be used for forming the hole transport layer 28b.

In addition, organic compounds having electron acceptors or organo metallic compounds easily accepting electrons may be used for forming the electron transport layer 28d.

In further detail, heterocyclic aromatic amine compounds containing an amine group may be used for the organic compounds, and Alq3 (tris(8-hydroxyquinolinato)aluminum) and derivatives of Alq3 may be used for the organic metal compounds.

Fluorescent or phosphorescent materials may be used for the light emitting layer 28c.

In further detail, among the fluorescent materials, one material selected from the group consisting of Alq3 (tris(8-hydroxyquinoline)-aluminum), 4-MAlq3 (tris(4-methyl-(8-hydroxyquinoline)-aluminum)), and C545T (10-(2-Benzothiazolyl)-2,3,6,7-tetrahydro-1,1,7,7,-tetramethyl), may be used for green, one material selected from the group consisting of DPVBi (diphenylvinylenebiphenylene), Spiro-DPVBi (spiro-(4,4-bis(2,2 diphenyl vinyl)-1,1-biphenyl)), Spiro-6P (2,2',7,7'-tetrakis(biphenyl-4-yl)-9,9'-spirobifluorene(spiro-sexiphenyl)), BAlq (4-biphenyloxolato aluminum (III)bis(2-methyl-8-quinolinato)-4-phenylphenolate), and LiPBO (2-(2-hydroxyphenyl)benzoxazolato lithium) may be used for blue, and one material selected from the group consisting of DCM (4-(Dicyanomethylene)-2-methyl-6-(p-dimethylaminostyryl)-4H-pyran), and DCTJB (4-(dicyanomethylene)-2-t-butyl-6-(1,1',7,7'-tetramethyljulolidyl-9-enyl)-4H-pyran) may be used for red.

In addition, one material selected from the group consisting of Alq3 (tris(8-hydroxyquinoline)-aluminum), 4-MAlq3 (tris(4-methyl-(8-hydroxyquinoline)-aluminum)), CBP (4,4'-N,N'-dicarbazol-biphenyl), BAlq (4-biphenyloxolato aluminum(III)bis(2-methyl-8-quinolinato)-4-phenylphenolate), BCP (bathocuproine), TCTA (4,4',4''-Tris(carbazol-9-yl)-triphenylamine), CDBP (4,4'-N,N'-dicarbazol-2,2'-dimethylbiphenyl), and mCP(N,N'-dicarbazolyl-3,5-benzene) may be used for phosphorescent host materials.

One material selected from the group consisting of PtOEP (2,3,7,8,12,13,17,18-octaethyl-12H,23H-porphyrine platinum(II)), Ir(ppy)$_3$ (fac-tris(2-phenylpyridine)iridium), BtpIr (bis(2-(2'-benzo[4,5-a]thienyl)-pyridinato-N, C3')iridium (acetyl-acetonate)), Btp$_2$Ir(acac) (bis(2-(2-benzo[4,5-a]thienyl)pyridinato-N,C2)iridium(acetylacetonate)), Q3Ir (tris(diphenylquinoxalinato)iridium), and Flrpic (iridium(III)bis[(4,6-di-fluorophenyl)-pyridinato-N,C2']picolinate) may be used for phosphorescent dopant materials.

Figure 6:
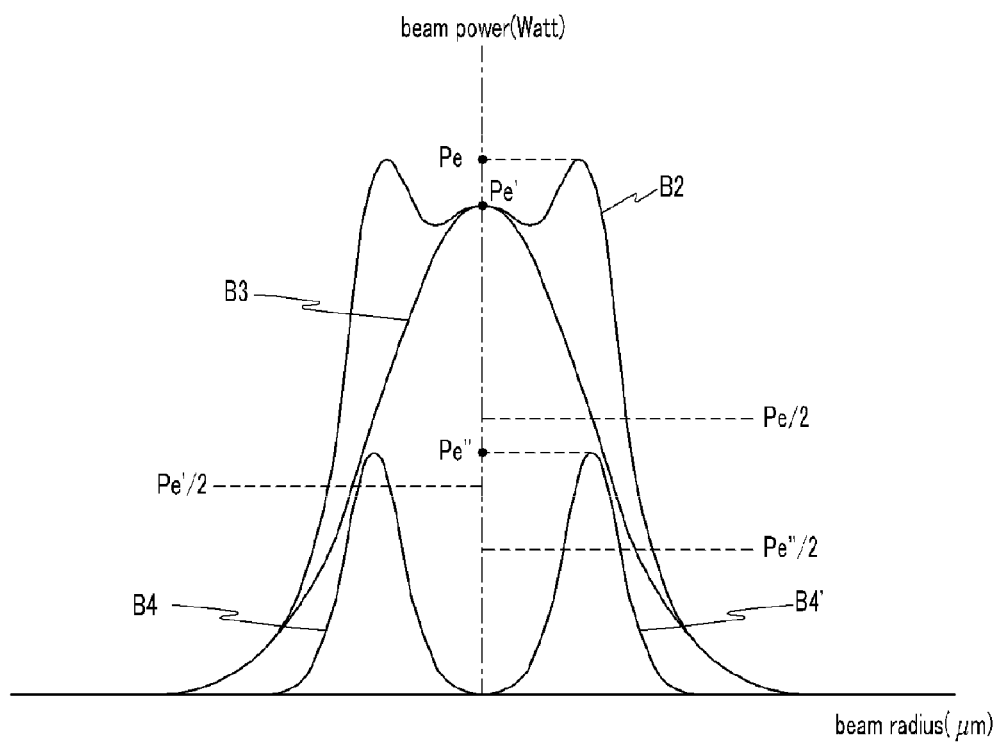
FIG. 6 shows a graph of cross sectional energy distribution of a laser beam used in the thermal transferring method of FIG. 3.

According to the exemplary embodiment of the present invention, a complex laser beam B2 shown in FIG. 6 is used when the organic layer 28 is formed.

The complex laser beam B2 is formed by more than two laser beams having different inclinations of energy distribution at threshold energy.

The complex laser beam B2 is formed by a laser beam B3 having gentle inclination of energy distribution at threshold energy Pe'/2 and laser beams B4 and B4' having steep inclination of energy distribution at threshold energy Pe''/2.

Here, a laser beam having a diameter ranging from 40 to 200 μm in a direction perpendicular to a scan direction and 1.0 to 6%/μm energy distribution inclination at the threshold energy Pe'/2 (e.g., Gaussian beam) may be used for the laser beam B3.

A Gaussian beam having 1.6%/μm energy distribution inclination at the threshold energy Pe'/2 is used for the laser beam B3 in the exemplary embodiment of the present invention.

In addition, a laser beam having a diameter ranging from 30 to 75 um in the direction perpendicular to the scan direction and energy distribution inclination ranging from 3 to 8%/um at the threshold energy Pe''/2 is used for the laser beams B4 and B4'.

Accordingly, forming the complex laser beam B2 by the composition of the laser beam B3 and the laser beams B4 and B4', the energy distribution inclination of the laser beam B2 at the threshold energy (Pe/2) reaches over 2.0%/μm which is greater than 1.6%/μm energy distribution inclination of the laser beam B3 at the threshold energy.

FIG. 5 shows a block diagram representing a manufacturing method of an OLED display according to an embodiment of the present invention. As noted in operation 51, an anode electrode layer is initially formed. Thereafter, at operation 52, an organic layer is formed by a complex laser beam having an inclination above 2%/μm at a Pe/2. At operation 53, a donor film is removed and a cathode electrode layer is formed at operation 54.

In the graph of in FIG. 6, the X-axis denotes a beam diameter in μm, and the Y-axis denotes beam power W.

Pe denotes a maximum beam power of the laser beam B2 (i.e, a peak value), Pe' denotes a peak value of the laser beam B3, and Pe'' denotes a peak value of the laser beam B4 and B4'.

In addition, the energy distribution inclination shows a variation rate % of beam power according to the variation amount in μm of the beam diameter, and the variation rate % of the beam power shows the variation amount of beam power with a percentage by setting peak values of the respective laser beams to 100.

Figure 2:
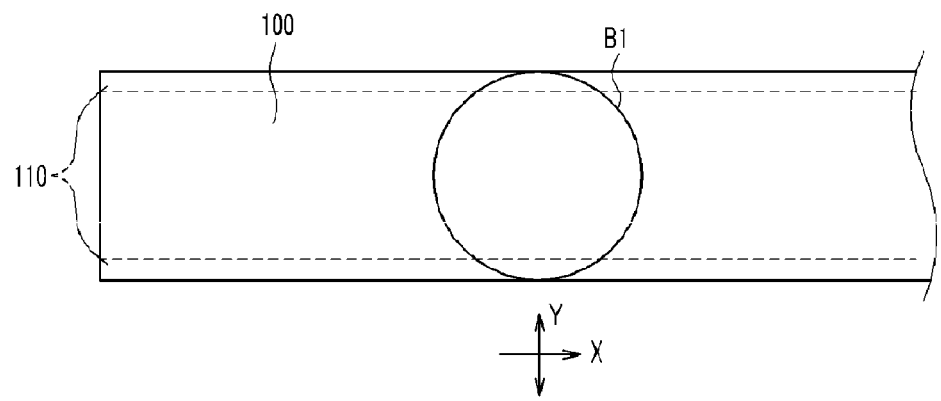
FIG. 2 shows a schematic diagram describing a pattern formation method in a conventional thermal transferring method.

The complex laser beam B2 is formed in an anisotropic beam shape of a scan direction (X-direction in FIG. 2) and a direction (Y-direction in FIG. 2) perpendicular to the scan direction, and the complex laser beam B2 has different beam diameters from each other.

For example, the complex laser beam B2 may be formed in an oval shape or a diamond shape having a long axis in the scan direction.

Scan speed varies depending on light emitting materials, and speed from 5 to 11 m/sec may be used when a complex laser beam having 8 W beam power is used.

The beam power at a central region is similar with the beam power at an edge region since the energy distribution inclination of the complex laser beam B2 of the above configuration is great at the threshold energy Pe/2.

Accordingly, since a thermal transfer is performed at an edge region of the organic layer 28 when the organic layer 28 is formed by transferring the donor film including light emitting materials by the complex laser beam B2, the surface roughness of the organic layer 28 may be prevented.

That is, the exemplary embodiment of the present invention prevents unevenness of the organic layer 28 caused when the beam power is increased to prevent pattern error at the edge region.

Figure 7:
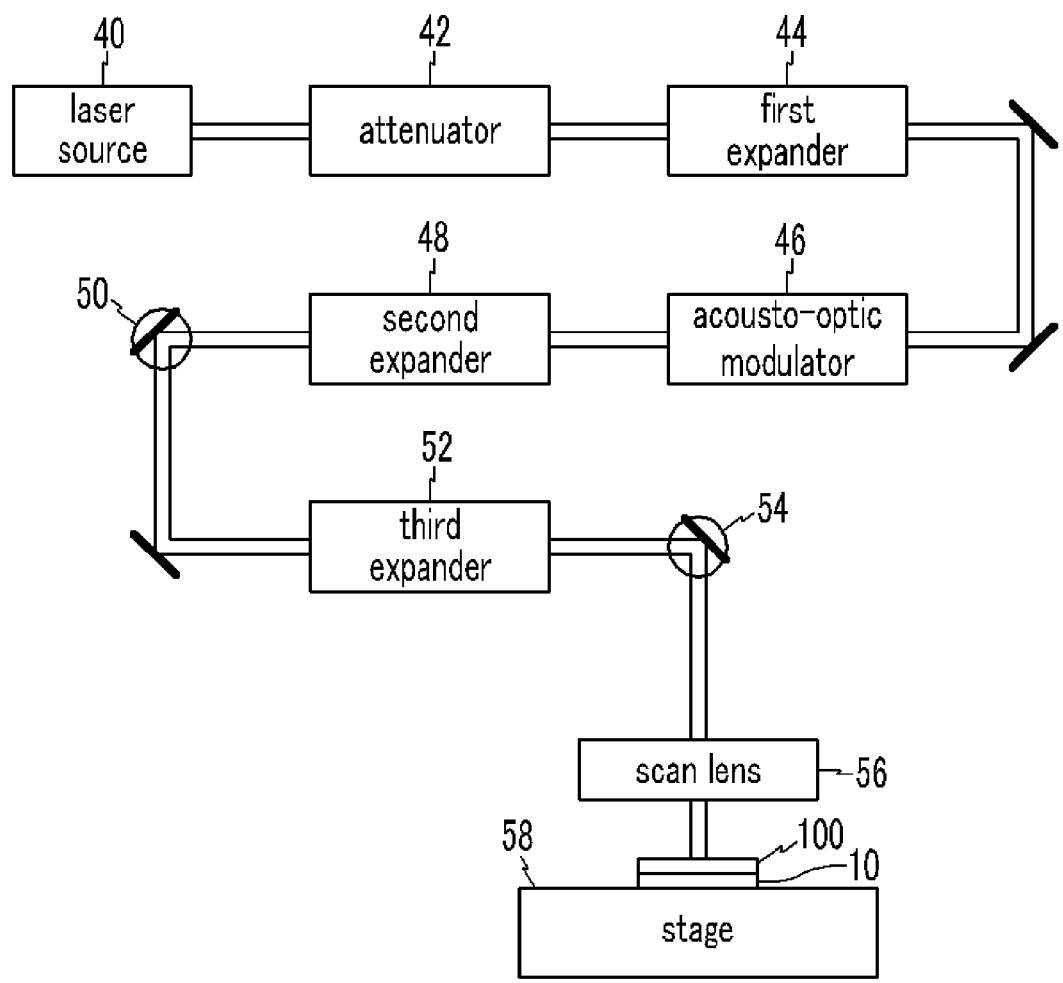
FIG. 7 shows a schematic diagram of a transferring device used in the thermal transferring method using the laser beam shown in FIG. 6.

FIG. 7 shows a schematic diagram of a transferring device used in the thermal transferring method of FIG. 6.

As shown in FIG. 7, a high output complex laser beam B2 is emitted from a laser source 40 which is a light source.

A high output solid laser using Nd/YAG or a gas laser using CO2 is used for the light source.

The complex laser beam B2 is scanned to a donor film 100 through an attenuator 42, a first expander 44, an acousto-optic modulator 46, a second expander 48, a Y-galvanometer 50, a third expander 52, an X-galvanometer 54, and scan lens 56.

The donor film 100 includes light emitting materials (e.g., fluorescent or phosphorescent materials), and the substrate 10 is formed on a stage 58.

Accordingly, the organic layer 28 is formed by transferring the light emitting materials in an area where the complex laser beam B2 is scanned onto the substrate 10, resulting in the organic layer 28 having high quality surface flatness and thickness uniformity of a pattern.

According to the exemplary embodiment of the present invention, the cathode electrode is formed on the organic layer after forming the anode electrode and pixel dielectric layer on the lower structure provided on the substrate and forming the organic layer using the complex laser beam having energy distribution inclination over 2%/μm at the threshold energy.

Accordingly, an OLED display having a high quality organic layer may be fabricated since an image quality at edge regions of the emitting layer may be improved and the flatness of the pattern surface is enhanced.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. An apparatus for manufacturing a display, the apparatus comprising:
   a light source emitting a complex laser beam;
   an attenuator directing the complex laser beam to a donor film disposed on a substrate;
   a scan lens scanning the complex laser beam over the donor film, the donor film transferring light emitting materials to the substrate forming the display; and
   a stage supporting the donor film and the substrate,
   wherein the complex laser beam is formed of more than two laser beams having different inclinations of energy distribution at a threshold energy.

2. The apparatus of claim 1, wherein the complex laser beam is a high output solid laser using Nd/YAG.

3. The apparatus of claim 1, wherein the complex laser beam is a gas laser using $CO_2$.

* * * * *